United States Patent
Kang

(10) Patent No.: US 11,222,799 B2
(45) Date of Patent: Jan. 11, 2022

(54) SWATH SELECTION FOR SEMICONDUCTOR INSPECTION

(71) Applicant: KLA-Tencor Corporation, Milpitas, CA (US)

(72) Inventor: Bosuk Kang, Uijeongbu (KR)

(73) Assignee: KLA Corporation, Milpitas, CA (US)

( * ) Notice: Subject to any disclaimer, the term of this patent is extended or adjusted under 35 U.S.C. 154(b) by 36 days.

(21) Appl. No.: 16/128,367

(22) Filed: Sep. 11, 2018

(65) Prior Publication Data

US 2019/0115236 A1 Apr. 18, 2019

Related U.S. Application Data

(60) Provisional application No. 62/573,811, filed on Oct. 18, 2017.

(51) Int. Cl.
*H01L 21/67* (2006.01)
*H04N 5/372* (2011.01)
*G01N 21/95* (2006.01)

(52) U.S. Cl.
CPC ... *H01L 21/67288* (2013.01); *G01N 21/9501* (2013.01); *H04N 5/37206* (2013.01)

(58) Field of Classification Search
CPC ..... G01N 21/9501; G01N 2021/95676; G01N 21/956; G01N 21/8851; G01N 21/95607; H01L 21/67288; H01L 22/12; H04N 5/37206; G03F 1/84; G03F 7/7065
See application file for complete search history.

(56) References Cited

U.S. PATENT DOCUMENTS

| 5,450,205 A | * | 9/1995 | Sawin | G01B 11/0675 |
| | | | | 216/60 |
| 6,020,957 A | | 2/2000 | Rosengaus et al. | |
| 6,867,406 B1 | * | 3/2005 | Fairley | G01N 21/9501 |
| | | | | 250/201.3 |
| 7,227,984 B2 | | 6/2007 | Cavan | |
| 2005/0249395 A1 | * | 11/2005 | Miller | G06T 7/0004 |
| | | | | 382/145 |
| 2006/0103838 A1 | * | 5/2006 | Richter | G01N 21/95607 |
| | | | | 356/237.5 |
| 2007/0230770 A1 | | 10/2007 | Kulkarni et al. | |

(Continued)

FOREIGN PATENT DOCUMENTS

JP 2009192371 A 8/2009

OTHER PUBLICATIONS

PCT/US2018/055791, International Search Report, dated Jan. 31, 2019.

(Continued)

*Primary Examiner* — James M Pontius
*Assistant Examiner* — Tyler B Edwards
(74) *Attorney, Agent, or Firm* — Huse IP Law; Charles C. Huse

(57) ABSTRACT

A semiconductor-inspection method is performed by a semiconductor-inspection system. In the method, user input is received that specifies a swath across a semiconductor die for inspection. The swath has a width that is less than a width of the semiconductor die and that corresponds to a field of view of the semiconductor-inspection system. The swath of the semiconductor die is inspected based on the user input. Data from inspecting the swath is processed to identify defects in the swath.

17 Claims, 5 Drawing Sheets

(56) References Cited

U.S. PATENT DOCUMENTS

| | | | |
|---|---|---|---|
| 2007/0288219 A1* | 12/2007 | Zafar | G06T 7/0008 |
| | | | 703/14 |
| 2009/0323052 A1 | 12/2009 | Silberstein et al. | |
| 2012/0205546 A1* | 8/2012 | Solarz | G01N 21/8806 |
| | | | 250/372 |
| 2013/0270444 A1 | 10/2013 | Subrahmanyan et al. | |
| 2014/0105482 A1* | 4/2014 | Wu | G01N 21/9501 |
| | | | 382/149 |
| 2015/0029499 A1* | 1/2015 | Wright | G01N 21/956 |
| | | | 356/237.5 |
| 2016/0209334 A1 | 7/2016 | Chen et al. | |
| 2016/0381282 A1* | 12/2016 | Bandlamudi | H04N 5/23296 |
| | | | 348/240.3 |

OTHER PUBLICATIONS

PCT/US2018/055791, Written Opinion of the International Searching Authority, dated Jan. 31, 2019.
Robert Cappel, Inspection Strategies for 10nm Design Node Challenges, SEMI (Oct. 11, 2016), available at http://www.semi.org/en/inspection-strategies-10nm-design-node-challenges.

* cited by examiner

400

```
┌─────────────────────────────────────────────────────────────────────────┐
│ Receive user input specifying a swath across a semiconductor die for    │
│ inspection. The swath has a width that is less than a width of the      │
│ semiconductor die and that corresponds to a field of view of the        │
│ semiconductor inspection system. (402)                                  │
│  ┌───────────────────────────────────────────────────────────────────┐  │
│  │ The input specifies a point within the swath (e.g., a center       │  │
│  │ position within the width of the swath) that corresponds to a      │  │
│  │ line across the swath. (404)                                       │  │
│  └───────────────────────────────────────────────────────────────────┘  │
│  ┌───────────────────────────────────────────────────────────────────┐  │
│  │ The semiconductor die includes a first portion having a first      │  │
│  │ height, a second portion having a second height that is less than  │  │
│  │ the first height, and a transition portion between the first       │  │
│  │ portion and the second portion. The line passes through the        │  │
│  │ transition portion. (406)                                          │  │
│  └───────────────────────────────────────────────────────────────────┘  │
└─────────────────────────────────────────────────────────────────────────┘
                                     ↓
┌─────────────────────────────────────────────────────────────────────────┐
│ Auto-focus on a portion of the swath (e.g., a portion corresponding to  │
│ the line across the swath). (408)                                       │
│  ┌───────────────────────────────────────────────────────────────────┐  │
│  │ Determine a focus offset used to inspect the swath. (410)          │  │
│  └───────────────────────────────────────────────────────────────────┘  │
│  ┌───────────────────────────────────────────────────────────────────┐  │
│  │ Auto-focus on the transition portion. (412)                        │  │
│  └───────────────────────────────────────────────────────────────────┘  │
└─────────────────────────────────────────────────────────────────────────┘
                                     ↓
┌─────────────────────────────────────────────────────────────────────────┐
│ Based on the user input, inspect the swath of the semiconductor die in  │
│ accordance with the auto-focusing. (414)                                │
│  ┌───────────────────────────────────────────────────────────────────┐  │
│  │ Perform time-delay integration. (416)                              │  │
│  └───────────────────────────────────────────────────────────────────┘  │
└─────────────────────────────────────────────────────────────────────────┘
                                     ↓
┌─────────────────────────────────────────────────────────────────────────┐
│ Process data from inspecting the swath to identify defects in the       │
│ swath. (418)                                                            │
└─────────────────────────────────────────────────────────────────────────┘
```

SWATH SELECTION FOR SEMICONDUCTOR INSPECTION

RELATED APPLICATION

This application claims priority to U.S. Provisional Patent Application No. 62/573,811, filed Oct. 18, 2017, titled "3D Flash Swath Optimization," which is hereby incorporated by reference in its entirety.

TECHNICAL FIELD

This disclosure relates to semiconductor inspection tools, and more specifically to user selection of swaths to be inspected on semiconductor die.

BACKGROUND

Semiconductor inspection tools may use time-delay integration (TDI) to inspect semiconductor die, in order to identify defects on the die. Such inspection tools use TDI to scan TDI swaths across the die, with respective TDI swaths being scanned and thus inspected sequentially. The inspection results may be compared to inspection results for other semiconductor die of the same type, to identify defects. Successive scanning of multiple TDI swaths is performed because the field of view of the inspection tool, and thus the TDI swath width, is typically less than the width of the die.

The swath layout is traditionally fixed for a given semiconductor die. For example, FIG. 1 shows a plan view of a semiconductor die 100 for which an inspection tool has a fixed layout of TDI swaths 110, starting from the top of the die 100. The inspection tool focuses on the center of each TDI swath 110, as indicated by the center lines 112.

Such focusing is problematic, however, because the height of different portions of the semiconductor die 100 may vary. For example, FIG. 2 shows a perspective view of the semiconductor die 100. The die 100 is a flash memory die that includes a plurality of flash memory-cell arrays 102. Each memory-cell array 102 has adjacent associated row-decoder ("X-Dec") circuitry 104 and an adjacent page buffer 106. The die 100 further includes peripheral logic circuitry 108. As FIG. 2 shows, the memory-cell arrays 102 are higher (e.g., 3-5 um higher) than the peripheral logic circuitry 108 (e.g., at a time during fabrication before a planarizing inter-layer dielectric has been deposited above the circuitry of FIGS. 1 and 2). This height difference exists because the flash memory cells of the memory-cell arrays 102 include oxide-nitride-oxide stacks that are absent from other circuitry such as the peripheral logic circuitry 108. Circuitry immediately adjacent to the memory-cell arrays 102, such as the row-decoder circuitry 104, occupies a transition region in which the die height transitions from a first value for the memory-cell arrays 102 to a second, lower value for the peripheral logic circuitry 108.

As seen in FIG. 1, the center lines 112 representing the locations on which the inspection tool focuses may not pass through the row-decoder circuitry 104. As a result, the inspection tool may perform its scans with a focus that is not ideal or even suitable for the row-decoder circuitry 104, making it difficult or impossible to detect defects in the row-decoder circuitry 104. Furthermore, this problem may make it necessary to perform multiple passes along each TDI swath 110 using different focus offsets, thus increasing inspection time, decreasing inspection throughput, and increasing the time for setting up inspection recipes.

SUMMARY

Accordingly, there is a need for methods and systems of allowing users to specify swaths for inspection.

In some embodiments, a method of semiconductor inspection is performed at a semiconductor-inspection system. In the method, user input is received that specifies a swath across a semiconductor die for inspection. The swath has a width that is less than a width of the semiconductor die and that corresponds to a field of view of the semiconductor-inspection system. The swath of the semiconductor die is inspected based on the user input. Data from inspecting the swath is processed to identify defects in the swath.

In some embodiments, a semiconductor-inspection system includes an inspection tool, one or more processors, and memory storing one or more programs for execution by the one or more processors. The one or more programs include instructions for performing the above method. In some embodiments, a non-transitory computer-readable storage medium stores one or more programs for execution by one or more processors of a semiconductor-inspection system that includes an inspection tool. The one or more programs include instructions for performing the above method.

BRIEF DESCRIPTION OF THE DRAWINGS

For a better understanding of the various described implementations, reference should be made to the Detailed Description below, in conjunction with the following drawings.

FIG. 4 is a flowchart showing a method of semiconductor inspection in accordance with some embodiments.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
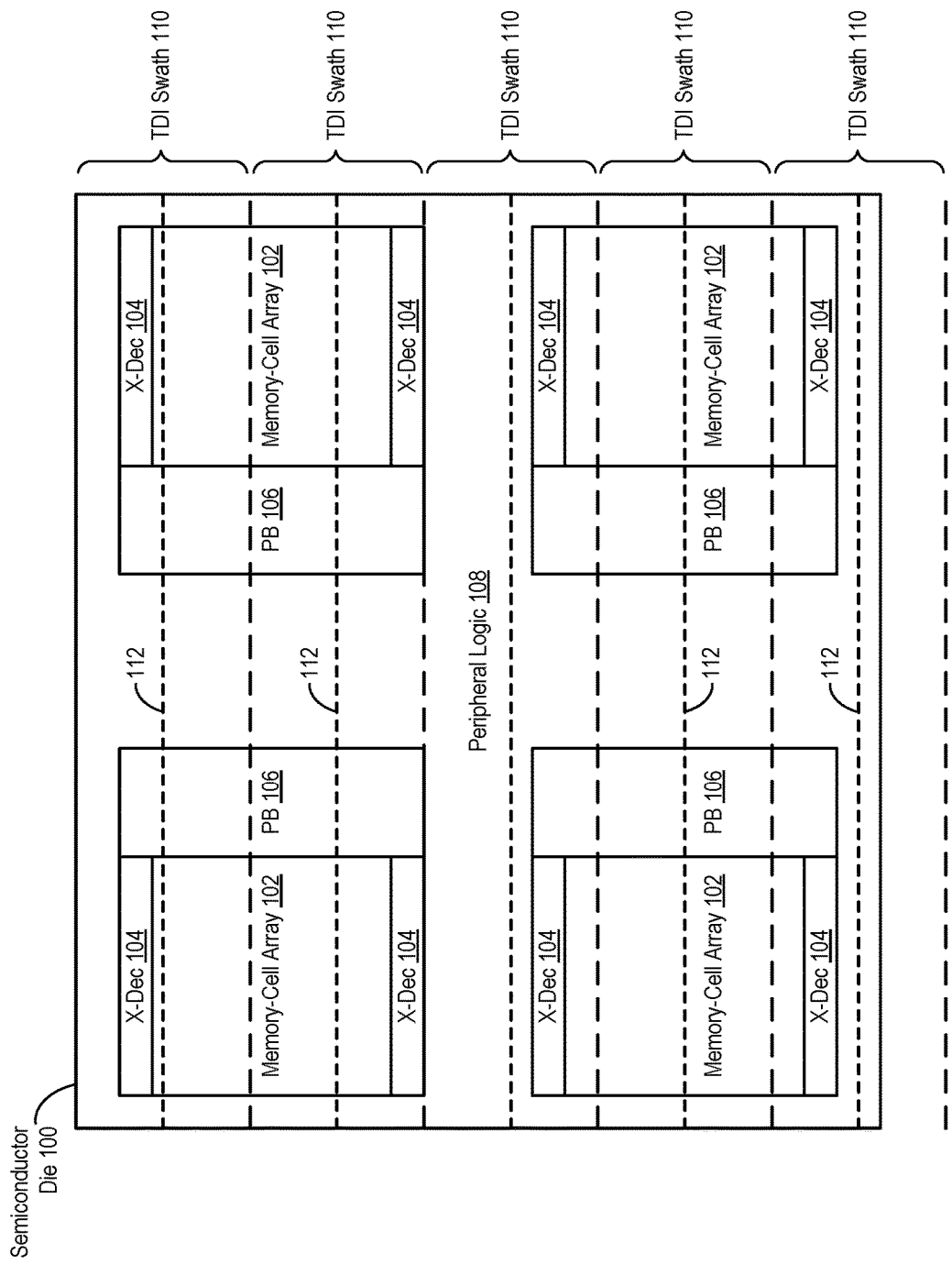
FIG. 1 shows a plan view of a semiconductor die for which an inspection tool has a fixed layout of time-delay integration (TDI) swaths.
Figure 3:
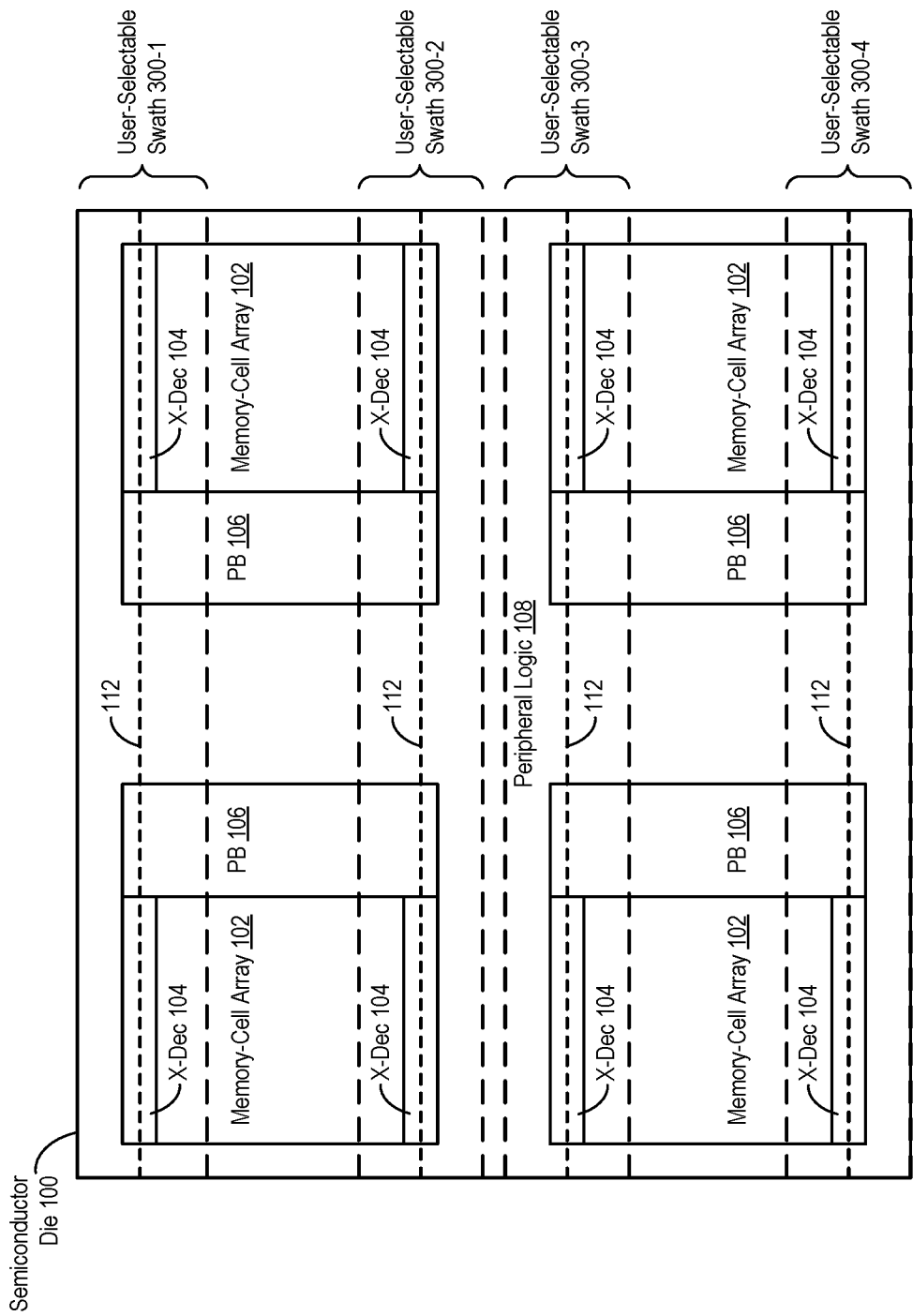
FIG. 3 shows a plan view of a user-selectable layout of swaths for the semiconductor die of FIGS. 1 and 2 in accordance with some embodiments.

To alleviate the problems caused by the fixed layout of the TDI swaths 110 (FIG. 1), an inspection tool may allow the positions of swaths on a die to be user-selectable. FIG. 3 shows a plan view of a user-selectable layout of swaths 300 (e.g., TDI swaths) for the semiconductor die 100 in accordance with some embodiments. The user may specify the location of each swath 300-1, 300-2, 300-3, and 300-4. The swaths 300 thus are user-selectable. In the example of FIG.

3, the user has specified the locations of the swaths 300-1, 300-2, 300-3, and 300-4 such that the center lines 112 of the swaths 300 pass through respective instances of the row-decoder circuitry 104, thereby allowing the inspection tool to focus on the row-decoder circuitry 104. As a result, the inspection tool may achieve higher quality, more precise inspection results for the row-decoder circuitry 104.

FIG. 4 is a flowchart showing a method 400 of semiconductor inspection in accordance with some embodiments. The method 400 may be performed by a semiconductor-inspection system 500 (FIG. 5) that includes a semiconductor inspection tool 504 and associated computer circuitry.

Figure 2:
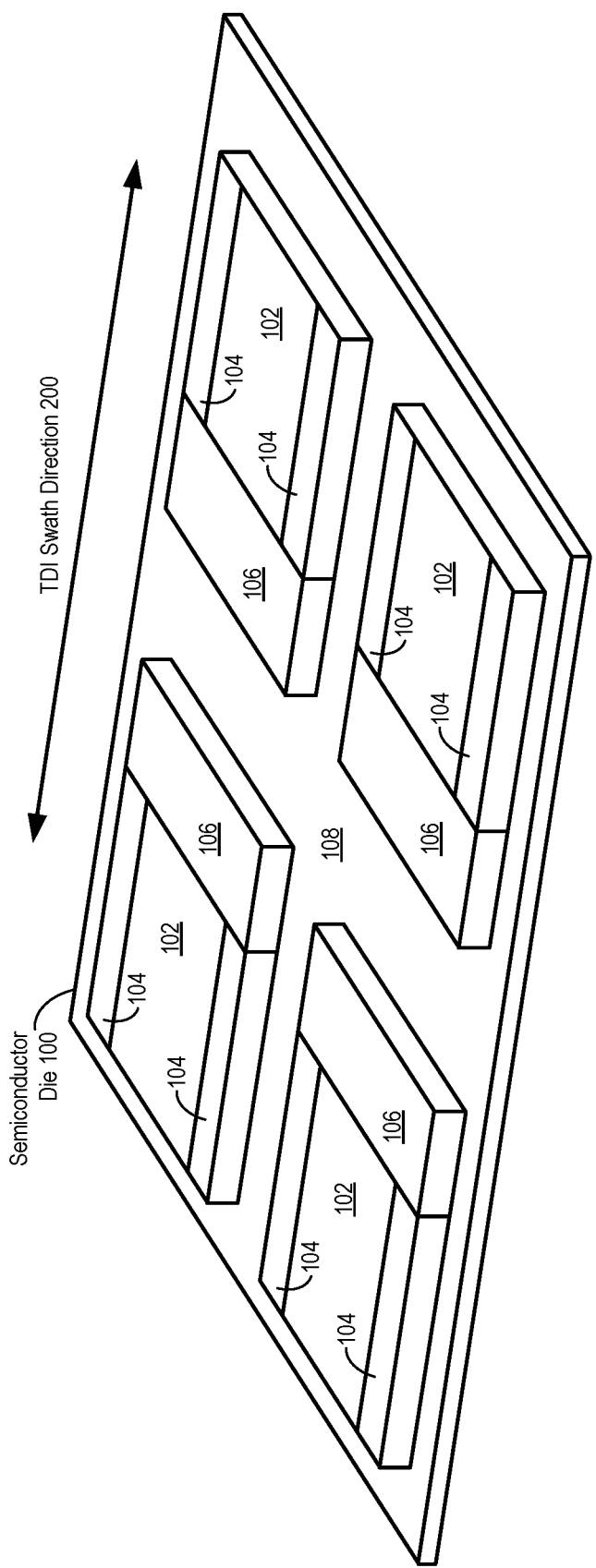
FIG. 2 shows a perspective view of the semiconductor die of FIG. 1 that illustrates a height difference between respective portions of the die.
Figure 5:
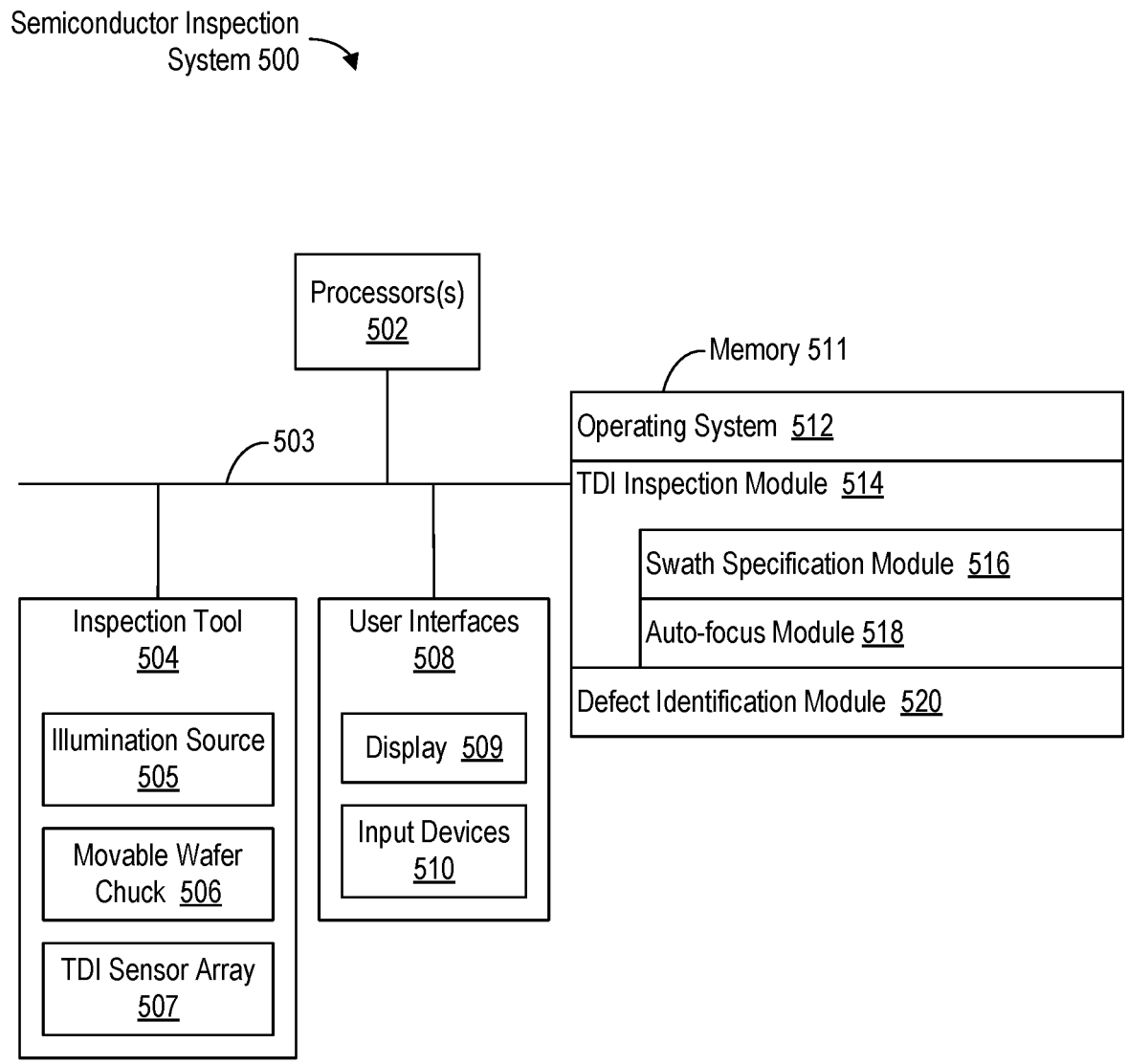
FIG. 5 is a block diagram of a semiconductor-inspection system in accordance with some embodiments.

In the method 400, user input is received (402) specifying a swath across a semiconductor die (e.g., semiconductor die 100, FIGS. 1-3) for inspection. In some embodiments, the semiconductor die is a flash memory die. Alternatively, the die is another type of semiconductor device. In some embodiments, the user input is received through an input device 510 (FIG. 5). Alternatively, the user input was previously provided and stored as part of a recipe, and is received as part of retrieving the recipe (e.g., from the memory 511 or from a remote computer system communicatively coupled with the semiconductor-inspection system 500, FIG. 5).

The swath (e.g., swath 300-1, 300-2, 300-3, or 300-4, FIG. 3) has a width that is less than a width of the semiconductor die and that corresponds to a field of view of the semiconductor-inspection system (e.g., of the inspection tool 504, FIG. 5). In some embodiments, the input specifies (404) a point within the swath that corresponds to a line across the swath. For example, the input specifies a center position within the width of the swath (e.g., by specifying a respective center line 112 or a point on a respective center line 112, FIG. 3). In other examples, the input may specify another position offset above or below the center position within the width of the swath. The width of the swath may be fixed or variable. For example, the width may have a first value in a first mode of the inspection tool 504 and a second value in a second mode of the inspection tool 504. The first mode may be a normal field-of-view mode (e.g., with a swath width of 550 um) and the second mode may be a reduced field-of-view mode (e.g., with a swath width of 280 um), in accordance with some embodiments.

In some embodiments, the semiconductor die includes a first portion having a first height, a second portion having a second height that is less than the first height, and a transition portion between the first portion and the second portion. The line passes (406) through the transition portion. For example, the first portion includes at least part of an array of flash memory cells (e.g., a memory-cell array 102, FIG. 3) and the second portion includes circuitry peripheral to the array of flash memory cells (e.g., peripheral logic circuitry 108, FIG. 3). In this example, the transition portion may include row-decoder circuitry 104 that is adjacent to the array.

A wafer that contains the semiconductor die is loaded into the inspection tool 504. The wafer may be loaded before or after the user input is received in step 402.

In some embodiments, the semiconductor inspection tool 504 auto-focuses (408) on a portion of the swath (e.g., a portion corresponding to the line across the swath, such as the center line 112). The user thus may specify the portion on which the semiconductor inspection tool 504 auto-focuses, in accordance with some embodiments. In some embodiments, a focus offset to be used to inspect the swath is determined (410). In some other embodiments, the focus offset may have been previously determined and stored as part of a recipe used in the method 400. In some embodiments (e.g., for which step 406 applies), the semiconductor inspection tool 504 auto-focuses (412) on the transition portion (e.g., on row-decoder circuitry 104).

The swath of the semiconductor die is inspected (414) based on the user input (e.g., in accordance with the auto-focusing). In some embodiments, time-delay integration is performed (416) to inspect the die, such that the swath is a TDI swath.

The data obtained from inspecting the swath is processed (418) to identify defects in the swath. For example, data obtained by inspecting the swath is compared to data obtained by inspecting the same swath on other die.

In some embodiments, the swath specified in step 402 is a first swath. The method 400 includes receiving user input specifying a plurality of swaths across the semiconductor die (e.g., all of the swaths 300-1, 300-2, 300-3, and 300-4, FIG. 3) for inspection. The plurality of swaths includes the first swath (e.g., swath 300-1, 300-2, 300-3, or 300-4, FIG. 3). Each swath of the plurality of swaths has a respective width that is less than the width of the semiconductor die. Each swath of the plurality of swaths may have the width of the first swath (e.g., a fixed width corresponding to a field of view of the inspection tool 504) or may have one or a plurality of available widths (e.g., with the available widths corresponding to respective modes of the inspection tool 504).

Each swath of the plurality of swaths is inspected based on the user input specifying the plurality of swaths (e.g., in accordance with the auto-focusing). The data obtained from inspecting each swath is processed to identify defects in the plurality of swaths.

In some embodiments, the semiconductor die is a first semiconductor die and the method 400 includes inspecting the specified swath for every semiconductor die in a row or column on the wafer that includes the first semiconductor die (e.g., in a single pass, which may be performed through a single translation of the movable wafer chuck 506, FIG. 5). Furthermore, the specified swath may be inspected for all or a portion of the die on the wafer. The data obtained from inspecting the specified swath on multiple die is processed to identify defects.

The method 400 thus allows accurate inspection of a particular portion of a semiconductor die, by allowing the inspection tool to focus on that portion. Throughput may be increased, by avoiding recipes that perform multiple passes with different focus offsets along the same swath. Similarly, the method 400 may reduce recipe set-up times. Furthermore, the swath or plurality of swaths being inspected may compose only part of the entire die. Throughput thus may also be increased by avoiding inspecting portions of the die that are not of interest.

FIG. 5 is a block diagram of a semiconductor-inspection system 500 in accordance with some embodiments. The semiconductor-inspection system 500 includes a semiconductor inspection tool 504 and associated computer circuitry, including one or more processors 502 (e.g., CPUs), user interfaces 508, memory 511, and one or more communication buses 503 interconnecting these components. The semiconductor-inspection system 500 may also include one or more network interfaces (wired and/or wireless, not shown) for communicating with (e.g., retrieving recipes from and/or transmitting data to) remote computer systems.

The inspection tool 504 includes an illumination source 505, a movable wafer chuck 506, and a TDI senor array 507. Semiconductor wafers are loaded onto the movable wafer chuck 506, which moves linearly (i.e., is linearly translated)

during inspection of a swath, to allow TDI to be performed. In some embodiments, the illumination source 505 is a broadband plasma (BBP) illumination source. Alternatively, a different type of illumination source 505 (e.g., a single-wavelength laser) is used.

The user interfaces 508 may include a display 509 and one or more input devices 510 (e.g., a keyboard, mouse, touch-sensitive surface of the display 509, etc.). A user may use the one or more input devices 510 to specify swaths. For example, an image of a semiconductor die (e.g., the die 100, FIGS. 1-3) may be displayed on the display 509. The user may draw a center line 112 (FIG. 3) or other line across a swath, select a point corresponding to the center line 112 or other line across the swath, or otherwise provide input indicating the location of the swath.

Memory 511 includes volatile and/or non-volatile memory. Memory 511 (e.g., the non-volatile memory within memory 511) includes a non-transitory computer-readable storage medium. Memory 511 optionally includes one or more storage devices remotely located from the processors 502 and/or a non-transitory computer-readable storage medium that is removably inserted into the server system 500. In some embodiments, memory 511 (e.g., the non-transitory computer-readable storage medium of memory 511) stores the following modules and data, or a subset or superset thereof: an operating system 512 that includes procedures for handling various basic system services and for performing hardware-dependent tasks, a TDI inspection module 514 (e.g., for performing all or a portion of steps 402-416 of the method 400, FIG. 4), and a defect identification module 520 (e.g., for performing step 418 of the method 400, FIG. 4). The TDI inspection module 514 may include a swath-specification module 516 and/or an auto-focus module 518, and may store one or more recipes for performing die inspection.

The memory 511 (e.g., the non-transitory computer-readable storage medium of the memory 511) thus includes instructions for performing all or a portion of the method 400 (FIG. 4). Each of the modules stored in the memory 511 corresponds to a set of instructions for performing one or more functions described herein. Separate modules need not be implemented as separate software programs. The modules and various subsets of the modules may be combined or otherwise re-arranged. In some embodiments, the memory 511 stores a subset or superset of the modules and/or data structures identified above.

FIG. 5 is intended more as a functional description of the various features that may be present in a semiconductor-inspection system than as a structural schematic. For example, the arrangement of the components of the inspection tool 504 may vary (e.g., in manners known in the art). Items shown separately could be combined and some items could be separated. Furthermore, the functionality of the semiconductor-inspection system 500 may be split between multiple devices. For example, a portion of the modules stored in the memory 511 may alternatively be stored in one or more computer systems communicatively coupled with the semiconductor-inspection system 500 through one or more networks.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method of semiconductor inspection, comprising, at a semiconductor-inspection system:
    displaying an image of a semiconductor die;
    receiving user input on the image specifying a location of a swath across the semiconductor die for inspection, the swath having a width that is less than a width of the semiconductor die and that corresponds to a field of view of the semiconductor-inspection system;
    based on the user input, inspecting the swath of the semiconductor die; and
    processing data from inspecting the swath to identify defects in the swath.

2. The method of claim 1, wherein the input specifies a position within the width of the swath.

3. The method of claim 2, wherein the position within the width of the swath, as specified by the user input, is a center position within the width of the swath.

4. The method of claim 3, further comprising, at the semiconductor-inspection system, auto-focusing on a portion of the swath at the position within the width of the swath, as specified by the user input;
    wherein inspecting the swath is performed in accordance with the auto-focusing.

5. The method of claim 4, wherein the auto-focusing comprises determining a focus offset used to inspect the swath.

6. The method of claim 2, further comprising, at the semiconductor-inspection system, auto-focusing on a portion of the swath at the position within the width of the swath, as specified by the user input;
    wherein inspecting the swath is performed in accordance with the auto-focusing.

7. The method of claim 6, wherein the auto-focusing comprises determining a focus offset used to inspect the swath.

8. The method of claim 6, wherein:
    the semiconductor die comprises a first portion having a first height, a second portion having a second height that is less than the first height, and a transition portion between the first portion and the second portion;
    the portion of the swath at the position within the width of the swath, as specified by the user input, passes through the transition portion; and
    the auto-focusing comprises auto-focusing on the transition portion.

9. The method of claim 8, wherein:
    the first portion comprises at least part of an array of flash memory cells; and
    the second portion comprises circuitry peripheral to the array of flash memory cells.

10. The method of claim 9, wherein the transition portion comprises row-decoder circuitry.

11. The method of claim 1, wherein:
    the swath is a time-delay integration swath; and
    inspecting the swath comprises performing time-delay integration.

12. The method of claim 1, wherein the swath is a first swath, the method comprising, at the semiconductor-inspection system:
    receiving user input specifying respective locations of a plurality of swaths across the semiconductor die for inspection, the plurality of swaths including the first swath, each swath of the plurality of swaths having a respective width that is less than the width of the semiconductor die;

based on the user input specifying the respective locations of the plurality of swaths, inspecting each swath of the plurality of swaths; and processing data from inspecting each swath to identify defects in the plurality of swaths.

13. The method of claim 12, wherein each swath of the plurality of swaths has the width of the first swath.

14. The method of claim 1, wherein the semiconductor die is situated in a row or column of semiconductor die on a semiconductor wafer, the method comprising, at the semiconductor-inspection system:

loading the semiconductor wafer into the semiconductor-inspection system; and after loading the semiconductor wafer, inspecting the swath of each semiconductor die in the row or column in a single pass.

15. The method of claim 1, wherein the semiconductor-inspection system comprises a broadband plasma illumination source.

16. A semiconductor-inspection system, comprising:

an inspection tool;

one or more processors; and memory storing one or more programs for execution by the one or more processors, the one or more programs comprising instructions for:

displaying an image of a semiconductor die;

receiving user input on the image specifying a location of a swath across the semiconductor die for inspection, the swath having a width that is less than a width of the semiconductor die and that corresponds to a field of view of the semiconductor-inspection system;

based on the user input, causing the inspection tool to inspect the swath of the semiconductor die; and processing data from inspecting the swath to identify defects in the swath.

17. A non-transitory computer-readable storage medium storing one or more programs for execution by one or more processors of a semiconductor-inspection system that includes an inspection tool, the one or more programs including instructions for:

displaying an image of a semiconductor die;

receiving user input on the image specifying a location of a swath across the semiconductor die for inspection, the swath having a width that is less than a width of the semiconductor die and that corresponds to a field of view of the semiconductor-inspection system;

based on the user input, causing the inspection tool to inspect the swath of the semiconductor die; and processing data from inspecting the swath to identify defects in the swath.

\* \* \* \* \*